US012332564B2

(12) United States Patent
Osumi

(10) Patent No.: US 12,332,564 B2
(45) Date of Patent: Jun. 17, 2025

(54) PHOTOSENSITIVE RESIN COMPOSITION FOR FLEXOGRAPHIC PRINTING

(71) Applicant: NIPPON SODA CO., LTD., Tokyo (JP)

(72) Inventor: Shota Osumi, Chiba (JP)

(73) Assignee: NIPPON SODA CO., LTD., Tokyo (JP)

( * ) Notice: Subject to any disclaimer, the term of this patent is extended or adjusted under 35 U.S.C. 154(b) by 333 days.

(21) Appl. No.: 17/923,873

(22) PCT Filed: May 12, 2021

(86) PCT No.: PCT/JP2021/017988

§ 371 (c)(1),
(2) Date: Nov. 7, 2022

(87) PCT Pub. No.: WO2021/230270

PCT Pub. Date: Nov. 18, 2021

(65) Prior Publication Data

US 2023/0176478 A1 Jun. 8, 2023

(30) Foreign Application Priority Data

May 15, 2020 (JP) ................................ 2020-085991

(51) Int. Cl.

| | |
|---|---|
| ***G03F 7/033*** | (2006.01) |
| ***C08F 287/00*** | (2006.01) |
| ***C08F 297/04*** | (2006.01) |
| ***G03F 7/029*** | (2006.01) |
| ***G03F 7/038*** | (2006.01) |

(52) U.S. Cl.

CPC .............. *G03F 7/033* (2013.01); *G03F 7/029* (2013.01); *G03F 7/0384* (2013.01)

(58) Field of Classification Search

CPC ........ G03F 7/027; G03F 7/033; G03F 7/0384; C08F 287/00; C08F 297/04

See application file for complete search history.

(56) References Cited

U.S. PATENT DOCUMENTS

| | | | | |
|---|---|---|---|---|
| 5,135,837 | A | 8/1992 | Swatton | |
| 5,798,202 | A * | 8/1998 | Cushner | B41C 1/05 430/286.1 |
| 2003/0036017 | A1 | 2/2003 | Tanizaki et al. | |
| 2004/0259022 | A1* | 12/2004 | Hiller | B41C 1/05 430/270.1 |
| 2011/0252993 | A1* | 10/2011 | Dottinger | B41C 1/05 430/300 |
| 2012/0015296 | A1 | 1/2012 | Maruno et al. | |
| 2012/0202910 | A1 | 8/2012 | Shirai et al. | |

FOREIGN PATENT DOCUMENTS

| | | |
|---|---|---|
| CZ | 20013391 A3 * | 3/2000 |
| JP | 2012-189848 | 10/2012 |
| JP | 2019-109436 | 7/2019 |
| WO | 2010/116743 | 10/2010 |
| WO | 2011/045918 | 4/2011 |

OTHER PUBLICATIONS

Official Communication issued in International Patent Application No. PCT/JP2021/017988, dated Aug. 3, 2021, along with English translation.

* cited by examiner

*Primary Examiner* — John S. Chu

(74) *Attorney, Agent, or Firm* — GREENBLUM & BERNSTEIN, P.L.C.

(57) ABSTRACT

A photosensitive resin composition for flexographic printing includes components (A) to (E) below: (A) a first styrene-butadiene-styrene block copolymer (SBS); (B) a second styrene-butadiene-styrene block copolymer (SBS); (C) a polybutadiene or a derivative thereof; (D) a photopolymerizable monomer; and (E) a photopolymerization initiator, and comprises with respect to (A), 5 to 100 wt % of (B), 10 to 40 wt % of (C), 40 to 200 wt % of (D), and 4 to 20 wt % of (E).

7 Claims, No Drawings

PHOTOSENSITIVE RESIN COMPOSITION FOR FLEXOGRAPHIC PRINTING

TECHNICAL FIELD

The present invention relates to a photosensitive resin composition for flexographic printing. This application claims priority to Japanese Patent Application No. 2020-085991, filed on May 15, 2020, the disclosure of which is incorporated herein by reference in its entirety.

BACKGROUND ART

Photosensitive resin compositions for flexographic printing generally contain a thermoplastic elastomer, a photopolymerizable unsaturated monomer, a plasticizer, and a photopolymerization initiator. As a structure for flexographic printing plate, a support such as a polyester film provided with the aforementioned photosensitive resin composition, a slip layer or a protective layer on the photosensitive resin composition in order to prevent the adhesion to a negative film, or a UV shielding layer containing an infrared sensitive substance that can be ablated with the infrared laser thereon is generally used. In order to make a flexographic printing plate from such a photosensitive resin plate material for flexographic printing plate, it is generally produced as follows. The entire surface is first exposed to ultraviolet rays through a support (back exposure) to provide a thin and uniform cured layer (floor layer). Then, image exposure (relief exposure) is performed directly on the surface of the photosensitive resin layer through a negative film or from above the UV shielding layer on which a photomask is formed by an infrared laser. After the unexposed part is washed away with a developing solvent or is absorbed and removed at an absorption layer after thermal fusion, post-treatment exposure is performed.

General printing using a photosensitive resin plate for flexographic printing is performed by supplying an ink onto the surface of the convex part of a resin plate with concavity and convexity by an ink supply roll, and then bringing the resin plate into contact with a material to be printed to transfer the ink on the surface of the convex part to the material to be printed. As the ink for such general flexographic printing, aqueous inks, emulsion inks, organic solvent-containing inks such as UV curable inks or inks using vegetable oils or light naphtha, or the like may be exemplified. In such flexographic printing in which an organic solvent for development is used at the time of plate making, the resistance to organic solvent-containing inks is required. If the solvent resistance is insufficient, the printing plate may break during long-term printing, and the printing plate may swell to deform, resulting in printing in a form other than the original pattern required for printing, which are problems.

In order to overcome the aforementioned problems, several methods have been proposed regarding the solvent resistance of such a photosensitive resin composition.

Patent Document 1 has proposed a photosensitive resin composition for flexographic printing, comprising a thermoplastic elastomer, a (meth)acrylic modified liquid polybutadiene containing 80% or more of 1,2-bonds, a photopolymerizable unsaturated monomer having one or more ethylenically unsaturated groups, and a photopolymerization initiator. It is described that the composition has both excellent resistance to inks and emulsion inks containing organic solvent used for flexographic printing such as UV curable inks or inks using vegetable oils or light naphtha and excellent suitability for printing applications such as image reproducibility and print durability.

Patent Document 2 discloses a flexographic printing plate making material composition comprising 50 to 90 mass % of a thermoplastic elastomer, 5 to 40 mass % of a specific polybutadiene, 1 to 30 mass % of an ethylenically unsaturated compound, and 0.1 to 3 mass % of a photopolymerization initiator, wherein the elastic modulus after photocuring is 80 to 150 MPa. The specific polybutadiene is obtained in the presence of a potassium salt in an aprotic polar solvent or a mixed solvent of an aprotic polar solvent and non-polar solvent in a method of producing a polybutadiene from 1,3-butadiene by anionic polymerization under the condition of a reaction temperature of the boiling point of butadiene or less and in the presence of a polymerization initiator. Further, it is described that a styrene-butadiene-styrene block polymer can be selected as the thermoplastic elastomer.

PRIOR ART DOCUMENTS

Patent Documents

Patent Document 1: International Publication No. WO 2010/116743

Patent Document 2: International Publication No. WO 2011/045918

SUMMARY OF THE INVENTION

Object to be Solved by the Invention

The cured products obtained from the compositions disclosed in Patent Documents 1 and 2 may have insufficient solvent resistance. It is an object of the present invention to provide a photosensitive resin composition for flexographic printing having excellent solvent resistance.

Means to Solve the Object

As a result of diligent studies in order to solve the above problems, the present inventors have accomplished the present invention.

The present invention includes the following aspects.

(1) A photosensitive resin composition for flexographic printing, comprising:
- (A) a first styrene-butadiene-styrene block copolymer (SBS);
- (B) a second styrene-butadiene-styrene block copolymer (SBS);
- (C) a polybutadiene or a derivative thereof;
- (D) a photopolymerizable monomer; and
- (E) a photopolymerization initiator.

(2) The photosensitive resin composition for flexographic printing according to (1), wherein a molar ratio of 1,2 bond structures to 1,4 bond structures in the butadiene block of the first styrene-butadiene-styrene block copolymer (SBS) (A) is 0:100 to 70:30.

(3) The photosensitive resin composition for flexographic printing according to (1) or (2), wherein the first styrene-butadiene-styrene block copolymer (SBS) (A) has a weight-average molecular weight (Mw) of 50,000 to 500,000.

(4) The photosensitive resin composition for flexographic printing according to any one of (1) to (3), wherein the first styrene-butadiene-styrene block copolymer (SBS) (A) has a molecular weight distribution (Mw/Mn) of 1 to 10.

(5) The photosensitive resin composition for flexographic printing according to any one of (1) to (4), wherein a weight ratio of the styrene block to the butadiene block in the first styrene-butadiene-styrene block copolymer (SBS) (A) is 10:90 to 80:20.

(6) The photosensitive resin composition for flexographic printing according to any one of (1) to (5), wherein a molar ratio of 1,2 bond structures to 1,4 bond structures in the butadiene block of the second styrene-butadiene-styrene block copolymer (SBS) (B) is 80:20 to 100:0.

(7) The photosensitive resin composition for flexographic printing according to any one of (1) to (6), wherein the second styrene-butadiene-styrene block copolymer (SBS) (B) has a weight-average molecular weight (Mw) of 10,000 to 100,000.

(8) The photosensitive resin composition for flexographic printing according to any one of (1) to (7), wherein the second styrene-butadiene-styrene block copolymer (SBS) (B) has a molecular weight distribution (Mw/Mn) of 1 to 3.

(9) The photosensitive resin composition for flexographic printing according to any one of (1) to (8), wherein a weight ratio of the styrene block to the butadiene block in the second styrene-butadiene-styrene block copolymer (SBS) (B) is 10:90 to 80:20.

(10) The photosensitive resin composition for flexographic printing according to any one of (1) to (9), wherein the composition comprises 5 to 100 wt % of the second styrene-butadiene-styrene block copolymer (SBS) (B) with respect to the first styrene-butadiene-styrene block copolymer (SBS) (A).

(11) The photosensitive resin composition for flexographic printing according to any one of (1) to (10), wherein a molar ratio of 1,2 bond structures to 1,4 bond structures in the polybutadiene or a derivative thereof (C) is 80:20 to 100:0.

(12) The photosensitive resin composition for flexographic printing according to any one of (1) to (11), wherein the polybutadiene or a derivative thereof (C) has a weight-average molecular weight (Mw) of 1,000 to 10,000.

(13) The photosensitive resin composition for flexographic printing according to any one of (1) to (12), wherein the polybutadiene or a derivative thereof (C) has a molecular weight distribution (Mw/Mn) of 1 to 3.

(14) The photosensitive resin composition for flexographic printing according to any one of (1) to (13), wherein the composition comprises 10 to 40 wt % of the polybutadiene or a derivative thereof (C) with respect to the first styrene-butadiene-styrene block copolymer (SBS) (A).

(15) The photosensitive resin composition for flexographic printing according to any one of (1) to (14), wherein the composition comprises 40 to 200 wt % of the photopolymerizable monomer (D) with respect to the first styrene-butadiene-styrene block copolymer (SBS) (A).

(16) The photosensitive resin composition for flexographic printing according to any one of (1) to (15), wherein the composition comprises 4 to 20 wt % of the photopolymerization initiator (E) with respect to the first styrene-butadiene-styrene block copolymer (SBS) (A).

Effect of the Invention

According to the photosensitive resin composition for flexographic printing of the present invention, a material for flexographic printing having excellent solvent resistance may be obtained.

MODE OF CARRYING OUT THE INVENTION

The photosensitive resin composition for flexographic printing of the present invention comprises a first styrene-butadiene-styrene block copolymer (component A), a second styrene-butadiene-styrene block copolymer (component B), a polybutadiene or a derivative thereof (component C), a photopolymerizable monomer (component D), and a photopolymerization initiator (component E).

(A First Styrene-Butadiene-Styrene Block Copolymer (Component A))

Component (A) in the photosensitive resin composition for flexographic printing of the present invention is a styrene-butadiene-styrene block copolymer (which may be hereinafter referred to as SBS). The styrene-butadiene-styrene block copolymer is a triblock copolymer in which a butadiene block and styrene blocks are bound in the order of a styrene block, the butadiene block, and another styrene block. Each styrene block is a block obtained by polymerizing styrene, and the butadiene block is a block obtained by polymerizing 1,3-butadiene.

The repeating units in the butadiene block of the first SBS used in the present invention consist of 1,2 bond structures of formula (1) below and 1,4 bond structures of formula (2) below or consists only of 1,4 bond structures of formula (2) below. The molar ratio of 1,2 bond structures to 1,4 bond structures constituting the butadiene block in the first SBS may be selected from 0:100 to 70:30, 0:100 to 60:40, 0:100 to 50:50, 0:100 to 40:60, 0:100 to 30:70, 0:100 to 20:80, or the like. The molar ratio of 1,2 bond structures to 1,4 bond structures may be calculated by $^{1}$H-NMR. That is, the ratio of 1,2- to 1,4-microstructures may be calculated from the integral value of protons of CH and $CH_2$ of —CH═$CH_2$ in the 1,2 bond structures and protons of two CH of —CH═CH— in the 1,4 bond structures.

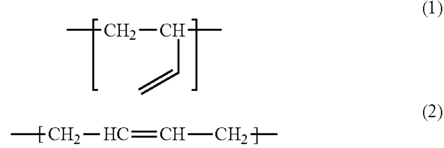

The weight-average molecular weight (Mw) of the first SBS used in the present invention is not specifically limited but may be selected from 50,000 to 500,000, 50,000 to 400,000, 50,000 to 300,000, 50,000 to 200,000, 100,000 to 500,000, and the like. The molecular weight distribution (Mw/Mn) of the first SBS used in the present invention is not specifically limited, but 1 to 10 may be exemplified. The weight-average molecular weight (Mw) and the molecular weight distribution (Mw/Mn) are measured by gel permeation chromatography (GPC) using polystyrene as a standard substance. The measurement conditions are a mobile phase of THF (tetrahydrofuran), a mobile phase flow rate of 1 mL/minute, a column temperature of 40° C., a sample injection volume of 40 μL, and a sample concentration of 2 wt %.

The weight ratio of the styrene block to the butadiene block in the first SBS used in the present invention is not specifically limited but may be selected from 10:90 to 80:20, 10:90 to 70:30, 10:90 to 60:40, 10:90 to 50:50, 20:90 to 50:50, or the like.

The method for producing the first SBS used in the present invention is not specifically limited, but the methods disclosed in Japanese unexamined Patent Application Publication No. 06-192502, Japanese unexamined Patent Application Publication (Translation of PCT Application) No. 2000-514122, Japanese unexamined Patent Application Publication No. 2007-302901, or the like and methods similar thereto may be used for the production. A commercially available product may be used as the first SBS. As the commercially available product, Kraton D1101JS (manufactured by Kraton Corporation), or the like may be exemplified.

(A Second Styrene-Butadiene-Styrene Block Copolymer (Component B))

Component (B) in the photosensitive resin composition for flexographic printing of the present invention is a styrene-butadiene-styrene block copolymer (SBS). The styrene-butadiene-styrene block copolymer is a triblock copolymer in which a butadiene block and styrene blocks are bound in the order of a styrene block, the butadiene block, and another styrene block. Each styrene block is a block obtained by polymerizing styrene, and the butadiene block is a block obtained by polymerizing 1,3-butadiene.

The repeating units in the butadiene block of the second SBS used in the present invention consist of 1,2 bond structures of formula (1) above and 1,4 bond structures of formula (2) above or consist only of 1,2 bond structures of formula (1) above. The molar ratio of 1,2 bond structures to 1,4 bond structures constituting the butadiene block in the second SBS may be selected from 80:20 to 100:0, 80:20 to 95:5, 85:15 to 95:5, or the like.

The molar ratio of 1,2 bond structures to 1,4 bond structures may be calculated by $^1$H-NMR. That is, the ratio of 1,2- to 1,4-microstructures may be calculated from the integral value of protons of CH and $CH_2$ of —CH═$CH_2$ in the 1,2 bond structures and protons of two CH of —CH═CH— in the 1,4 bond structures.

The weight-average molecular weight (Mw) of the second SBS used in the present invention is not specifically limited but may be selected from 10,000 to 100,000, 10,000 to 90,000, 10,000 to 80,000, 10,000 to 70,000, 10,000 to 60,000, 10,000 to 50,000, or the like. The molecular weight distribution (Mw/Mn) of the second SBS used in the present invention is not specifically limited, but 1 to 3 may be exemplified. The weight-average molecular weight (Mw) and the molecular weight distribution (Mw/Mn) are measured by gel permeation chromatography (GPC) using polystyrene as a standard substance. The measurement conditions are a mobile phase of THF (tetrahydrofuran), a mobile phase flow rate of 1 mL/minute, a column temperature of 40° C., a sample injection volume of 40 μL, and a sample concentration of 2 wt %.

The weight ratio of the styrene block to the butadiene block in the second SBS used in the present invention is not specifically limited but may be selected from 10:90 to 80:20, 20:80 to 80:20, 30:70 to 80:20, 40:60 to 80:20, 40:60 to 70:30, 40:60 to 60:40, or the like.

The method for producing the second SBS used in the present invention is not specifically limited, but the methods disclosed in Japanese unexamined Patent Application Publication No. 06-192502, Japanese unexamined Patent Application Publication (Translation of PCT Application) No. 2000-514122, Japanese unexamined Patent Application Publication No. 2007-302901, or the like and methods similar thereto may be used for the production.

The amount of the second SBS comprised in the photosensitive resin composition for flexographic printing of the present invention is not specifically limited, but 5 to 100 wt % of the second SBS with respect to the amount of the first SBS may be exemplified.

(A Polybutadiene or a Derivative Thereof (Component C))

Component (C) in the photosensitive resin composition for flexographic printing of the present invention is a polybutadiene or a derivative thereof. The polybutadiene is a polymer obtained by polymerizing 1,3-butadiene. The polybutadiene derivative includes hydrogenated polybutadienes and terminally modified polybutadienes, which will be described below.

The repeating units in the polybutadiene used in the present invention consist of 1,2 bond structures of formula (1) above and 1,4 bond structures of formula (2) above, consist only of 1,2 bond structures of formula (1) above, or consist only of 1,4 bond structures of formula (2) above. The molar ratio of 1,2 bond structures to 1,4 bond structures constituting the polybutadiene is not specifically limited but may be selected from 80:20 to 100:0, 80:20 to 95:5, 85:15 to 95:5, or the like. The molar ratio of 1,2 bond structures to 1,4 bond structures may be calculated by $^1$H-NMR. That is, the ratio of 1,2- to 1,4-microstructures may be calculated from the integral value of protons of CH and $CH_2$ of —CH═$CH_2$ in the 1,2 bond structures and protons of two CH of —CH═CH— in the 1,4 bond structures.

A part or all of 1,2 bond structures of formula (1) above and 1,4 bond structures of formula (2) above, which are repeating units in the polybutadiene used in the present invention, may be hydrogenated. When partially hydrogenated, the hydrogenation rate may be selected from 1 to 99 mol %, 1 to 90 mol %, 1 to 80 mol %, 1 to 70 mol %, 1 to 60 mol %, 1 to 50 mol %, 1 to 40 mol %, 1 to 30 mol %, 1 to 20 mol %, 1 to 10 mol %, or the like. The hydrogenation rate is a proportion of the hydrogenated repeating units in all repeating units constituting the polybutadiene.

The polybutadiene used in the present invention may have a modified terminal structure. As the polybutadiene with a modified terminal structure, those having various structures such as those having a hydroxyl group-modified terminal, acrylic-modified terminals, methacrylic-modified terminals, and carboxylic acid groups-modified terminals may be exemplified, but there is no limitation to these examples.

The weight-average molecular weight (Mw) of the polybutadiene or a derivative thereof used in the present invention is not specifically limited but may be selected from 1,000 to 10,000, 1,000 to 5,000, or the like. The molecular weight distribution (Mw/Mn) of the polybutadiene used in the present invention is not specifically limited, but 1 to 3 may be exemplified. The weight-average molecular weight (Mw) and the molecular weight distribution (Mw/Mn) are values obtained by converting the data measured by gel permeation chromatography (GPC) using tetrahydrofuran as a solvent based on the molecular weight of standard polystyrene.

The method for producing the polybutadiene or a derivative thereof used in the present invention is not specifically limited, and a known method may be used for the production. Further, the polybutadiene or a derivative thereof used in the present invention may be a commercially available product.

As the polybutadiene or a derivative thereof used in the present invention, polybutadienes with unmodified terminal such as NISSO-PB B-1000 (manufactured by Nippon Soda Co., Ltd.), NISSO-PB B-2000 (manufactured by Nippon Soda Co., Ltd.), and NISSO-PB B-3000 (manufactured by Nippon Soda Co., Ltd.), hydrogenated polybutadienes such as NISSO-PB BI-2000 (manufactured by Nippon Soda Co., Ltd.), and NISSO-PB BI-3000 (manufactured by Nippon Soda Co., Ltd.), polybutadienes modified with hydroxyl groups at both terminals such as NISSO-PB G-1000 (manufactured by Nippon Soda Co., Ltd.), NISSO-PB G-2000 (manufactured by Nippon Soda Co., Ltd.), and NISSO-PB G-3000 (manufactured by Nippon Soda Co., Ltd.), hydrogenated polybutadienes modified with hydroxyl groups at both terminals such as NISSO-PB GI-1000 (manufactured by Nippon Soda Co., Ltd.), NISSO-PB GI-2000 (manufactured by Nippon Soda Co., Ltd.), and NISSO-PB GI-3000 (manufactured by Nippon Soda Co., Ltd.), and polybutadienes modified with methacrylic groups at both terminals such as NISSO-PB TE-2000 (manufactured by Nippon Soda Co., Ltd.) may be specifically exemplified.

The amount of the polybutadiene or a derivative thereof comprised in the photosensitive resin composition for flexographic printing of the present invention is not specifically limited, but an amount of the polybutadiene or a derivative thereof of 10 to 40 wt % with respect to the amount of the first SBS may be exemplified.

(A Photopolymerizable Monomer (Component D))

As a photopolymerizable monomer, a monofunctional or a multifunctional monomer may be used. As such a compound, for example, compounds having a carbon-carbon double bond may be exemplified, and specifically, unsaturated carboxylic acid ester compounds; unsaturated carboxylic acid amide compounds; allyl compounds; styrene compounds; and N-substituted maleimide compounds, or the like may be exemplified.

Further specifically, the following compounds may be exemplified.

As a monofunctional monomer, (meth)acrylic acid ester compound such as methyl (meth)acrylate, ethyl (meth)acrylate, t-butyl (meth)acrylate, and lauryl (meth)acrylate;

(meth)acrylic acid amide compound such as (meth)acrylamide and diacetoneacrylamide;

allyl compound such as allyl acetate, allyl methyl ether, and allyl phenyl ether;

styrene compound such as styrene, α-methylstyrene, and vinyltoluene;

fumaric acid or maleic acid ester compound such as dimethyl fumarate, diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, and dibehenyl fumarate;

N-substituted maleimide compound such as N-n-hexyl maleimide, N-cyclohexyl maleimide, N-n-octyl maleimide, N-2-ethylhexyl maleimide, N-n-decyl maleimide, and N-n-lauryl maleimide, or the like may be exemplified.

As a multifunctional monomer, bifunctional ethylenically unsaturated compound such as ethylene glycol di(meth)acrylate, diethylene glycol di(meth)acrylate, 1,3-butylene glycol di(meth)acrylate, tripropylene glycol di(meth)acrylate, 1,4-butanediol di(meth)acrylate, neopentyl glycol di(meth)acrylate, 1,6-hexanediol di(meth)acrylate, 1,9-nonane diol di(meth)acrylate, polyethylene glycol di(meth)acrylate, divinyl benzene, and diallyl phthalate;

trifunctional ethylenically unsaturated compound such as trimethylolpropane tri(meth)acrylate and triallyl cyanurate;

tetrafunctional ethylenically unsaturated compound such as pentaerythritol tetra(meth)acrylate, or the like may be exemplified.

These compounds may be used alone or used by combination of two or more thereof.

The amount of the photopolymerizable monomer comprised in the photosensitive resin composition for flexographic printing of the present invention is not specifically limited, but the amount of the photopolymerizable monomer may be selected from 40 to 200 wt %, 40 to 150 wt %, 50 to 150 wt %, or the like with respect to the amount of the first SBS.

(A Photopolymerization Initiator (Component E))

As photopolymerization initiators, benzoin and its alkyl ether compound such as benzoin, benzoin methyl ether, benzoin ethyl ether, benzoin isopropyl ether, benzoin isobutyl ether, and benzyl methyl ketal; acetophenone compound such as acetophenone, 2,2-dimethoxy-2-phenyl acetophenone, 2-hydroxy-2-methyl-1-phenyl propane-1-one, diethoxyacetophenone, 2,2-diethoxy-2-phenyl acetophenone, 1,1-dichloroacetophenone, 1-hydroxycyclohexyl phenyl ketone, and 2-methyl-1-[4-(methylthio)phenyl]-2-morpholino-propane-1-one; anthraquinone compound such as methyl anthraquinone, 2-ethyl anthraquinone, 2-tertiary butyl anthraquinone, 1-chloroanthraquinone, and 2-amyl anthraquinone; thioxanthone compound such as thioxanthone, 2,4-diethyl thioxanthone, 2-chlorothioxanthone, 2,4-dichlorothioxanthone, 2-methyl thioxanthone, and 2,4-diisopropyl thioxanthone; ketal compound such as acetophenone dimethyl ketal and benzyl dimethyl ketal; benzophenone compound such as benzophenone and 4,4-bismethylamino benzophenone, or the like may be specifically exemplified. These may be used alone or used by combination of two or more thereof.

The amount of the photopolymerization initiator comprised in the photosensitive resin composition for flexographic printing of the present invention is not specifically limited, but the amount of the photopolymerization initiator may be selected from 4 to 20 wt %, 4 to 15 wt %, 5 to 15 wt %, or the like with respect to the amount of the first SBS.

(Other Components)

In addition to components A to E, plasticizers, ultraviolet absorbers, antioxidants, polymerization inhibitors, pigments, inorganic fine particles, or the like may be optionally added to the photosensitive resin composition for flexographic printing of the present invention.

(Method for Producing Photosensitive Resin Composition for Flexographic Printing)

The photosensitive resin composition for flexographic printing of the present invention may be produced by mixing the components. For mixing, the components dissolved in a suitable solvent such as chloroform, tetrachloroethylene, methyl ethyl ketone, toluene, ethyl acetate, tetrahydrofuran, hexane, cyclohexane, may be mixed, casted into the mold to evaporate the solvent, and formed into a plate as it is, or this plate of photosensitive elastomer composition may be heat-pressed, to obtain an accurate layer. After kneading using a kneader, a roll mill, or the like, a layer having a desired thickness may be produced by hot press molding, calendar treatment, or extrusion molding. The support and the flexible film layer may be brought into close contact with the photosensitive layer by roll laminating after sheet molding. It is also possible to obtain a more accurate photosensitive layer by heating and pressing after laminating.

(Method for Processing Photosensitive Resin Composition for Flexographic Printing)

As active light sources to be used for solvent insolubilization of the photosensitive resin composition for flexographic printing of the present invention, low-pressure mercury lamps, medium-pressure mercury lamps, high-pressure mercury lamps, ultrahigh-pressure mercury lamps, metal halide lamps, UV fluorescent lamps, carbon arc lamps, xenon lamps, zirconium lamps, sunlight, or the like may be exemplified. As a developer for eluting the unexposed part after irradiating the photosensitive resin composition for flexographic printing of the present invention with light through a transparent image carrier to form an image by photoirradiation, a developer that swells and dissolves the unexposed part is used, but it is desirable that the developer does not affect the exposed image part so much. For example, tetrachloroethylene, toluene, acetic acid esters, limonene, decahydronaphthalen, petroleum-based aromatic hydrocarbons, etc., and a mixture of these with 60 wt % or less of an alcohol such as n-butanol, 1-pentanol, benzyl alcohol, may be exemplified.

The unexposed part is eluted by spraying from a nozzle or by brushing with a brush. Since the printed plate obtained by elution of the unexposed part with a solvent is swollen by the developer solvent, it is dried in a forced air flow or an infrared oven. The drying temperature and time are generally 60° C. for 30 to 120 minutes. The composition of the present invention may have stickiness remaining on the plate surface even after drying is completed, depending on the composition. In that case, the stickiness may be removed by a known surface treatment method. As a method of surface treatment, an exposure treatment with an active light having a wavelength of 300 nm or less is preferable.

EXAMPLES

Hereinafter, the present invention will be described in detail with reference to the examples, but the present invention is not intended to be limited to the examples. Hereinafter, PB means polybutadiene, and PS means polystyrene.

Production Example 1: Production of the Second Styrene-Butadiene-Styrene Block Copolymer (A)

1893.91 g of cyclohexane and 306.92 g of tetrahydrofuran were added to a 5000-mL flask. After the temperature was raised to 30° C., 25.32 g of n-butyllithium (15.1-wt % hexane solution) was added thereto. After stirring for 10 minutes, 150.32 g of styrene was added dropwise, followed by stirring for 10 minutes. Gas chromatography (hereinafter abbreviated as GC) was performed to confirm the disappearance of the monomer. Then, a mixed solution of 301.30 g of butadiene and 197.50 g of hexane was added dropwise, followed by stirring for 15 minutes. After GC was performed to confirm the disappearance of the monomer, 150.30 g of styrene was added dropwise. After stirring for 30 minutes, 10.40 g of methanol was added thereto.

The copolymer obtained was analyzed by gel permeation chromatography (mobile phase: tetrahydrofuran, polystyrene standard), to confirm that it was a copolymer having a weight-average molecular weight (Mw) of 19603, a molecular weight distribution (Mw/Mn) of 1.16, and a composition ratio of PS/PB/PS=25/50/25 wt %. The reaction solution was washed twice with water, and then the solvent was distilled off. Vacuum drying was performed to afford styrene-butadiene-styrene copolymer (A) (white powder). The molar ratio of 1,2 bond structures to 1,4 bond structures in the butadiene block calculated by $^1$H-NMR was 94:6.

Production Example 2: Production of the Second Styrene-Butadiene-Styrene Block Copolymer (B)

439.50 g of cyclohexane and 32.45 g of tetrahydrofuran were added to a 1000-mL flask. After the temperature was raised to 30° C., 3.82 g of n-butyllithium (15.1-wt % hexane solution) was added thereto. After stirring for 10 minutes, 61.22 g of styrene was added dropwise, followed by stirring for 10 minutes. Gas chromatography (hereinafter abbreviated as GC) was performed to confirm the disappearance of the monomer. Then, a mixed solution of 61.05 g of butadiene and 39.20 g of hexane was added dropwise, followed by stirring for 15 minutes. After GC was performed to confirm the disappearance of the monomer, 0.66 g of 1,2-dibromoethane was added dropwise. After the completion of dropwise addition, 2.12 g of methanol was added thereto, to stop the reaction.

The copolymer obtained was analyzed by gel permeation chromatography (mobile phase: tetrahydrofuran, polystyrene standard), to confirm that it was a copolymer having a weight-average molecular weight (Mw) of 43663, a molecular weight distribution (Mw/Mn) of 1.24, a coupling rate of 80%, and a composition ratio of PS/PB/PS=25/50/25 wt %. The reaction solution was washed twice with water, and then the solvent was distilled off. Vacuum drying was performed to afford styrene-butadiene-styrene copolymer (B) (white powder). The molar ratio of 1,2 bond structures to 1,4 bond structures in the butadiene block calculated by $^1$H-NMR was 85:15.

Production and Processing of Photosensitive Resin Composition for Flexographic Printing

Example 1

50 parts of Kraton D1101JS (manufactured by Kraton Corporation) (the first SBS), 5 parts of SBS (A) (the second SBS) synthesized in Production Example 1, 10 parts of B-1000 (polybutadiene, manufactured by Nippon Soda Co., Ltd.), 30 parts of 1,6-hexanediol diacrylate (product manufactured by Tokyo Chemical Industry Co., Ltd., hereinafter, HDDA), 3 parts of benzyl methyl ketal (manufactured by Sigma-Aldrich Co. LLC.), and 1.9 parts of dibutylhydroxytoluene (manufactured by KANTO CHEMICAL CO., INC., hereinafter, BHT) were mixed and dissolved in cyclohexane to a non-volatile content concentration of 20%. The cyclohexane solution obtained was air-dried overnight in an aluminum cup and further dried by heating at 50° C. for 5 hours. Then, it was irradiated with a 10 mW ultra-high pressure mercury lamp so that the integrated amount of light was about 6000 mJ/cm$^2$. This photocured film was peeled off from the aluminum cup to obtain a UV cured film having a film thickness of about 1 mm.

Example 2

A UV cured film was obtained in the same manner as in Example 1 except that the added amount of Kraton D1101JS (manufactured by Kraton Corporation) (the first SBS) was changed to 40 parts, and the added amount of SBS (A) (the second SBS) synthesized in Production Example 1 was changed to 15 parts.

Example 3

A UV cured film was obtained in the same manner as in Example 1 except that the added amount of Kraton D1101JS (manufactured by Kraton Corporation) (the first SBS) was changed to 30 parts, and the added amount of SBS (A) (the second SBS) synthesized in Production Example 1 was changed to 25 parts.

Example 4

A UV cured film was obtained in the same manner as in Example 1 except that SBS (B) (the second SBS) synthesized in Production Example 2 was used instead of SBS (A) (the second SBS) synthesized in Production Example 1.

Example 5

A UV cured film was obtained in the same manner as in Example 2 except that SBS (B) (the second SBS) synthesized in Production Example 2 was used instead of SBS (A) (the second SBS) synthesized in Production Example 1.

Example 6

A UV cured film was obtained in the same manner as in Example 3 except that SBS (B) (the second SBS) synthesized in Production Example 2 was used instead of SBS (A) (the second SBS) synthesized in Production Example 1.

Comparative Example 1

A UV cured film was obtained in the same manner as in Example 1 except that the added amount of Kraton D1101JS (manufactured by Kraton Corporation) (the first SBS) was changed to 55 parts, and SBS (A) (the second SBS) synthesized in Production Example 1 was not added.

(Hardness Measurement)

For the UV cured films obtained in Examples 1 to 6 and Comparative Example 1, hardness was measured with a durometer according to JIS K 7215.

(Solvent Resistance Test)

Each of the UV cured films obtained in Examples 1 to 6 and Comparative Example 1 was cut to 5 cm×5 cm in the longitudinal and lateral directions to produce test pieces, and the test pieces were immersed into a beaker filled with ethyl acetate. The swelling rate was calculated by comparing the weights 15 minutes, 30 minutes, and 60 minutes after immersion with the weight before immersion.

Table 1 shows the composition, the hardness, and the results of the solvent resistance test of each of Examples 1 to 6 and Comparative Example 1.

The invention claimed is:

1. A photosensitive resin composition for flexographic printing, comprising:

(A) a first styrene-butadiene-styrene block copolymer (SBS), wherein a weight ratio of the styrene block to the butadiene block is 10:90 to 80:20, and a molar ratio of 1,2 bond structures to 1,4 bond structures in the butadiene block is 0:100 to 70:30;

(B) a second styrene-butadiene-styrene block copolymer (SBS), wherein a weight ratio of the styrene block to the butadiene block is 10:90 to 80:20, and a molar ratio of 1,2 bond structures to 1,4 bond structures in the butadiene block is 80:20 to 100:0;

(C) a polybutadiene or a derivative thereof, wherein a molar ratio of 1,2 bond structures to 1,4 bond structures is 80:20 to 100:0;

(D) a photopolymerizable monomer; and (E) a photopolymerization initiator, comprising 5 to 100 wt % of the second styrene-butadiene-styrene block copolymer (SBS) (B) with respect to the amount of the first styrene-butadiene-styrene block copolymer (SBS) (A), comprising 10 to 40 wt % of the polybutadiene or a derivative thereof (C) with respect to the amount of the first styrene-butadiene-styrene block copolymer (SBS) (A), comprising 40 to 200 wt % of the photopolymerizable monomer (D) with respect to the amount of the first styrene-butadiene-styrene block copolymer (SBS) (A), and comprising 4 to 20 wt % of the photopolymerization initiator (E) with respect to the amount of the first styrene-butadiene-styrene block copolymer (SBS) (A).

2. The photosensitive resin composition for flexographic printing according to claim 1, wherein the first styrene-butadiene-styrene block copolymer (SBS) (A) has a weight-average molecular weight (Mw) of 50,000 to 500,000.

3. The photosensitive resin composition for flexographic printing according to claim 1, wherein the first styrene-butadiene-styrene block copolymer (SBS) (A) has a molecular weight distribution (Mw/Mn) of 1 to 10.

4. The photosensitive resin composition for flexographic printing according to claim 1, wherein the second styrene-

TABLE 1

| | | Comparative Example 1 | Example 1 | Example 2 | Example 3 | Example 4 | Example 5 | Example 6 |
|---|---|---|---|---|---|---|---|---|
| Kraton D1101JS (parts) | | 55 | 50 | 40 | 30 | 50 | 40 | 30 |
| SBS(A) (parts) | | — | 5 | 15 | 25 | — | — | — |
| SBS(B) (parts) | | — | — | — | — | 5 | 15 | 25 |
| B-1000 (parts) | | 10 | 10 | 10 | 10 | 10 | 10 | 10 |
| HDDA (parts) | | 30 | 30 | 30 | 30 | 30 | 30 | 30 |
| Benzyl methyl ketal (parts) | | 3 | 3 | 3 | 3 | 3 | 3 | 3 |
| BHT (parts) | | 1.9 | 1.9 | 1.9 | 1.9 | 1.9 | 1.9 | 1.9 |
| Cyclohexane (parts) | | 400 | 400 | 400 | 400 | 400 | 400 | 400 |
| Hardness | | A61<br>D20 | A82<br>D22 | A86<br>D34 | A90<br>D42 | A72<br>D26 | A78<br>D32 | A84<br>D39 |
| Swelling rate (wt %) | 15 minutes after immersion | 128.7 | 122 | 116.9 | 113.4 | 122.8 | 119.3 | 117 |
| | 30 minutes after immersion | 139.6 | 137.4 | 132 | 120.5 | 139.3 | 132.6 | 128.9 |
| | 60 minutes after immersion | 152.7 | 144 | 142.2 | 135.1 | 150.9 | 148 | 145.3 |

In the table,"—" means "Not used".

butadiene-styrene block copolymer (SBS) (B) has a weight-average molecular weight (Mw) of 10,000 to 100,000.

5. The photosensitive resin composition for flexographic printing according to claim 1, wherein the second styrene-butadiene-styrene block copolymer (SBS) (B) has a molecular weight distribution (Mw/Mn) of 1 to 3.

6. The photosensitive resin composition for flexographic printing according to claim 1, wherein the polybutadiene or a derivative thereof (C) has a weight-average molecular weight (Mw) of 1,000 to 10,000.

7. The photosensitive resin composition for flexographic printing according to claim 1, wherein the polybutadiene or a derivative thereof (C) has a molecular weight distribution (Mw/Mn) of 1 to 3.

* * * * *